United States Patent [19]

Shibamiya

[11] Patent Number: 5,020,022
[45] Date of Patent: May 28, 1991

[54] PRINTING APPARATUS FOR USE WITH A DETACHABLE MEMORY

[75] Inventor: Yoshikazu Shibamiya, Tokyo, Japan

[73] Assignee: Canon Kabushiki Kaisha, Tokyo, Japan

[21] Appl. No.: 285,301

[22] Filed: Dec. 15, 1988

[30] Foreign Application Priority Data

Mar. 15, 1984 [JP] Japan ................................. 59-48171

[51] Int. Cl.$^5$ ........................................ G06F 13/00
[52] U.S. Cl. ................................. 364/900; 400/54; 340/686
[58] Field of Search ... 364/200 MS File, 900 MS File, 364/519, 520; 100/53; 400/54, 69, 663, 664, 667, 668, 692; 340/686, 687

[56] References Cited

U.S. PATENT DOCUMENTS

| | | | |
|---|---|---|---|
| 3,823,388 | 7/1974 | Chadima, Jr. et al. | 364/900 |
| 4,019,174 | 4/1977 | Vanderpool | 364/900 |
| 4,388,010 | 6/1983 | Mott et al. | 365/52 X |
| 4,512,253 | 4/1985 | La Barge et al. | 100/99 X |

FOREIGN PATENT DOCUMENTS 57-44174  3/1982  Japan ................................. 400/54

Primary Examiner—David L. Clark
Attorney, Agent, or Firm—Fitzpatrick, Cella, Harper & Scinto

[57] ABSTRACT

An printing apparatus has a connection member for use in detachably mounting a memory device to the apparatus and performs information processing based upon read-out information from the memory device. The electronic apparatus is provided with an execution unit which in response to information pertaining to the connection and/or disconnection of the memory device to the printing apparatus provided by connection member, stops the information processing and executes initialization of the apparatus.

7 Claims, 3 Drawing Sheets

PRINTING APPARATUS FOR USE WITH A DETACHABLE MEMORY

This application is a continuation of application Ser. No. 028,012 filed Mar. 18, 1987 filed Mar. 18, 1987 which is a continuation of application Ser. No. 709,610 filed Mar. 8, 1985 now abandoned.

BACKGROUND OF THE INVENTION

The present invention relates to information processing apparatus such as typewriters, word processors or the like using external memories for storing font styles.

Electronic apparatuses having detachable external memory devices including a ROM for generating a character (hereinafter referred to as CG ROM), are known in the art. Some of them are provided with lock mechanisms by which the external memory devices are prevented from being removed while being accessed. Also known is a buffer provided between the external memory devices and such apparatuses. The buffer electrically cuts off the main parts of the electronic apparatus from the external memory device, thereafter the removal of the latter from the former is carried out. These known arrangements are effective and necessary for those apparatuses requiring high reliability regardless of expense.

The above protective arrangements, however, necessarily are not provided where the cost of such a protective arrangement increases enormously and accounts for the most part of the cost of the apparatus as a whole; no serious problems arise while detaching the external memory device, such as breakdown of the main body of the electronic apparatus, and the removal of the external memory device from the electronic apparatus during operation can apparently be considered as user's mishandling.

In particular, taking an electronic typewriter as one example of such electronic apparatuses, the external memory device, i.e., CG ROM package is accessed during printing out. If the CG ROM package is intended to be removed during printing out, there arises a problem that some portions of the printed pattern are lost. Even if the apparatus is constructed to enable intermittent printing out stoppage while the device is detached, some difficulties in printing may occur if a different CG ROM instead of the detached one is inserted (for instance, another CG ROM in which a different pitch between characters is assigned). Moreover, another problem may arise that during the removal and/or mounting operations for the CG ROM package, noises may be superposed on the bus line S1 which might cause the CPU to malfunction.

In view of the above, it is an object of the present invention to provide an electronic apparatus which can perform suitable information and processing provide a counter measure against the removal and/or mounting i.e., disconnection and/or connection of an external memory device during operation of the apparatus.

It is another object of the present invention to provide an electronic apparatus having a connector for detachably mounting an external memory device, and a recorder, such as a printer for generating images basing upon read-out information from the external memory device, which is so constructed as to stop the recording operation and to execute an initializing routine, in response to the removal and/or mounting information from the connector.

DETAILED DESCRIPTION OF THE PREFERRED EMBODIMENT

The present invention will now be described in detail with reference to the accompanying drawings.

Figure 1:
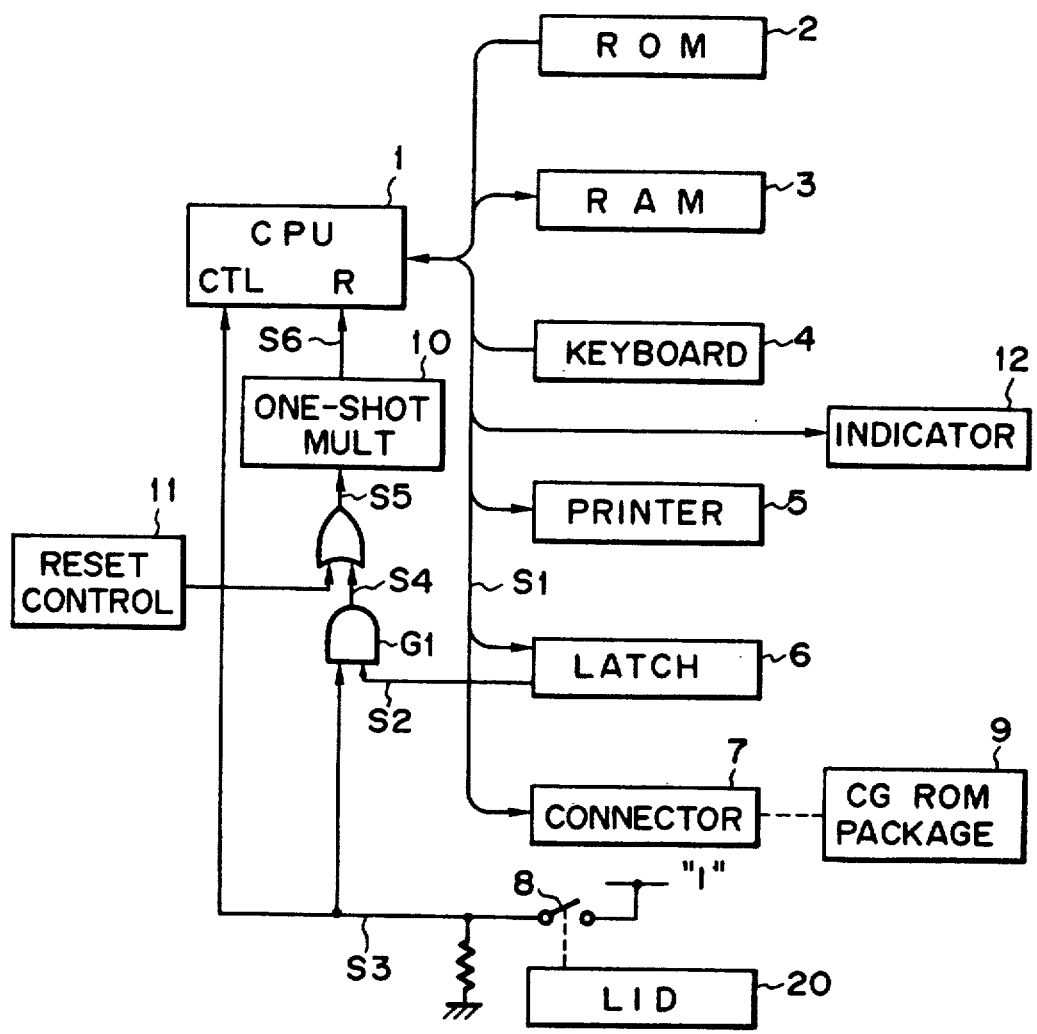
FIG. 1 is a block diagram of an embodiment of the apparatus according to the present invention.

FIG. 1 is a block diagram of an electronic apparatus which, for example, may be used in an electronic typewriter incorporating the present invention. In the figure, reference number 1 represents a micro processor which functions as a CPU (Central Processor Unit). The CPU 1 reads programs stored in a ROM 2 described later to perform operations and judgements under control of the programs. The CPU 1 further controls a RAM 3, keyboard 4, printer 5, latch circuit 6, and CG ROM package 9, all of them being described later, to thereby perform editing and printing out documents.

Figure 4:
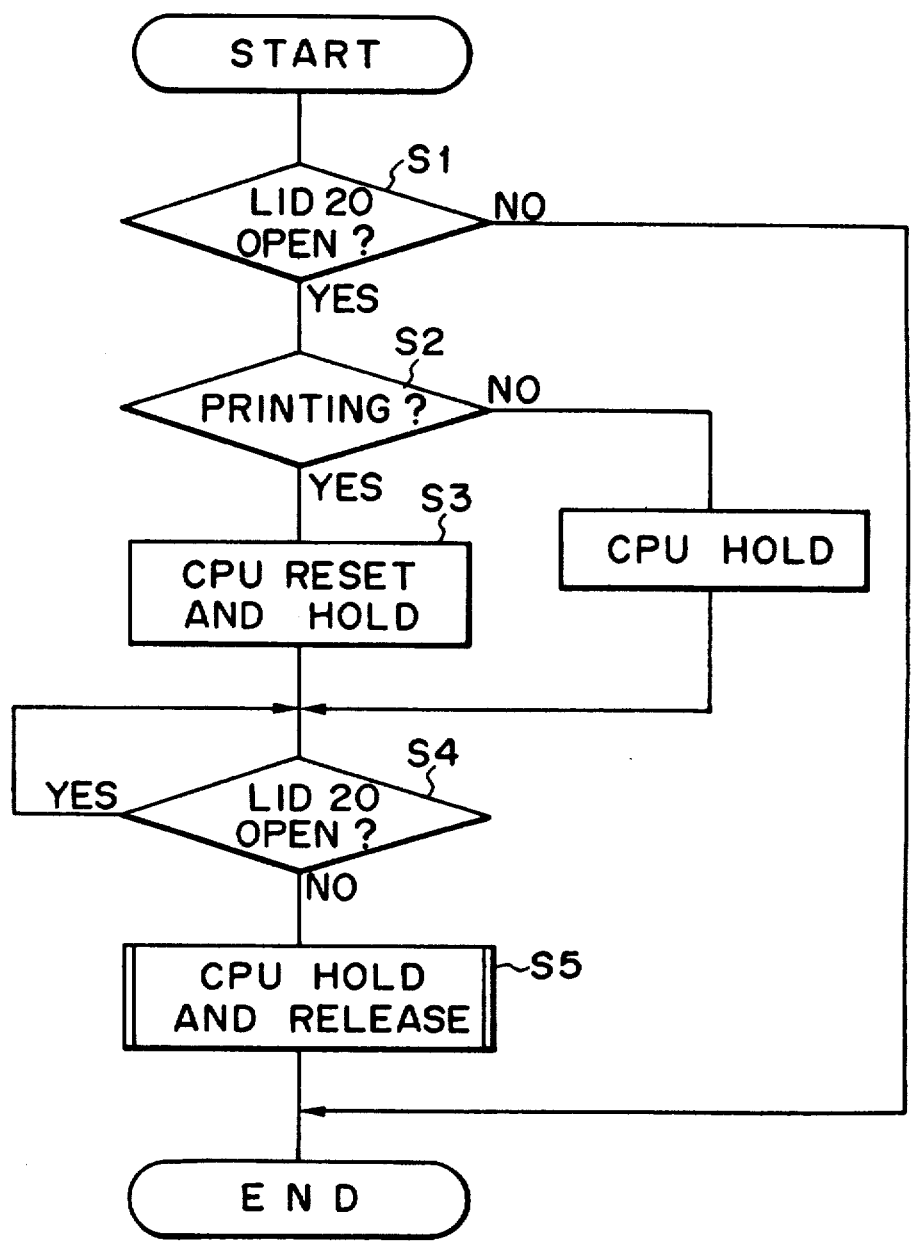
FIG. 4 is a flow chart showing a control sequence according to the embodiment of the present invention.

ROM 2 is a read only memory in which a control sequence as shown in FIG. 4 for driving the CPU 1 into operation is written. RAM 3 is a read-write memory for temporarily storing the results of calculated data by the CPU 1 during its operation. The keyboard 4 is an input unit for the apparatus through which various data for editing and printing out documents are input.

Figure 2:
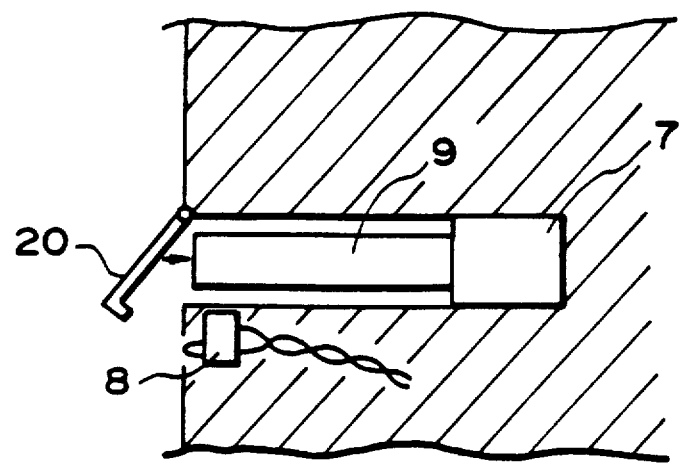
FIG. 2 is a view explaining the mounted state of a ROM package for generating characters.
Figure 3:
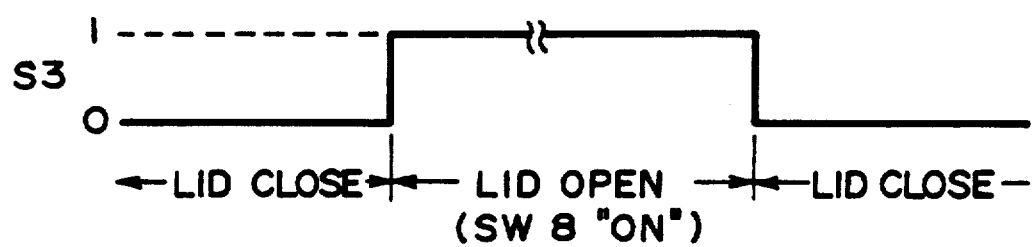
FIG. 3 is a diagram for explaining a level change on a signal line S3 shown in FIG. 1.

The CPU 1 reads out dot patterns from the CG ROM package 9 corresponding to the input data from the keyboard 4 to perform printing with the printer 5. The latch circuit 6 latches the contents of flag indicative of the state of the printer 5. Reference number 7 represents a connecter for effecting the connection between the CG ROM package 9 and the apparatus main body. Reference number 8 is a switch for detecting the contact state of the package. The mounting section for the CG ROM package 9 in the apparatus is provided with a lid as shown in FIG. 2. Thus, when the lid 20 is opened so as to remove the CG ROM package 9, the switch 8 is actuated to turn on.

The CG ROM package 9 contains therein a ROM storing dot patterns for the printing. Reference number 10 represents a one-shot multivibrator which outputs one pulse with a constant width onto a signal line S6 in response to the leading edge of a pulse on a signal line S5. Reference number 11 is a power-on reset control circuit which operates when a power switch is turned on.

Reference S1 represents a bus line including a group of signal lines through which the CPU controls the above described circuit elements 2 to 7. Reference S2 represents a signal line on which signals indicative of the flag state set during the printing operation appear. In particular, the CPU 1 makes the latch circuit 6 latch a logical level "1" while the printer 5 is under operation, and makes the latch circuit 6 latch a logical level "0" during other operations. The logical level "1" or "0" is thus delivered onto the signal line S2 in accordance with the state of operations.

Reference S3 represents a signal line to which a signal indicative of the open/close state of the lid 20 shown in FIG. 2 is delivered. In the present embodiment, the mounting section for the CG ROM 9 is so arranged that the lid 20 must positively be opened if the CG ROM package 9 is intended to be removed or mounted.

Reference number 12 represents a display unit for displaying data from the keyboard 4, results calculated by the CPU 1, or the like.

In the embodiment, assuming now that the CG ROM package 9 is connected to the connecter 7. The CPU 1 reads out the dot pattern in the CG ROM 9 based upon the key input data from the keyboard 4, and in turn executes the printing by controlling the printer 5. In this case, a logical level "1" is written in the latch circuit 6 and the logical level on the signal line S2 is "1". Alternatively, as described above, while the printing is not under way, a logical level "0" is on the signal line S2.

It is here assumed that the printing is not under way (i.e., the CG ROM is not being used) and that documents are keyed in using the display unit 12. Under these circumstances, if the lid 20 is opened so as to remove the CG ROM 9, the switch 8 is turned "ON" so that a signal of logical level "1" appears on the signal line S3. At this time, however, since the signal line S2 is of "0" level, the output signal line S4 of an AND gate 31 maintains a "0" level. Consequently, the one-shot multivibrator 10 is not actuated and the CPU 1 is not reset.

Since the signal line S3 is coupled to a control terminal CTL of the CPU 1, upon detection of the "ON" state of the switch 8, the CPU 1 is rendered in a hold state (or temporal termination of the operation) so as to keep it from operating erroneously while the CG ROM package 9 is removed or mounted. After completion of the mounting of the CG ROM package 9 and the lid 20 is closed, the switch 8 turns "OFF" to resume the operation by the CPU 1.

Alternatively, it is assumed that the lid 20 is opened to remove the CG ROM package 9 while the signal line S2 is at "1" level under the printing operation. Then, the switch 8 turns "ON" so that the CPU 1 is forced into a temporary termination of the operation, with the "ON" signal being supplied through the signal line S3. At this time, since the signal levels on the signal lines S4 and S5 change, the one-shot multivibrator 10 is driven into operation (or is set). Consequently, a one-shot pulse is delivered onto the signal line S6 to reset terminal R of the CPU 1. Thereafter, as the lid 20 is closed and the switch 8 is turned "OFF", the CPU 1 starts the operation to execute an initializing routine. In other words, according to the present embodiment, closing the lid 20 renders the CPU 1 in the same state as that obtained when the power switch of the apparatus is turned on.

FIG. 4 is an outline of a flow chart illustrating the control sequence of the CPU according to the above described embodiment.

In the above embodiment, although the removal or mounting of the external memory is detected by the particular structure of the mounting section for the memory, it is apparent that other suitable means are also applicable, such as detecting the mounting of the external memory as the interception of light.

As described above, according to the present invention, in the case that an external memory such as CG ROM package is removed or mounted during the printing operation, the whole apparatus can resume the state obtained when the power is turned on (i.e., initial conditions). Therefore, various disadvantages which might occur when the printing is stopped in the midst of its operation, can be avoided. In addition it is possible to suggest the user that the removal or mounting of the CG ROM package is prohibited if the printing operation is under way.

What is claimed is:

1. A printing apparatus comprising:
   printing means for printing indicia on a printing medium;
   connection means for detachably connecting a memory to the apparatus;
   processing means for controlling the apparatus, accessing data stored in the memory connected to the apparatus, and controlling said printing means in accordance with the accessed data; and
   detection means for detecting removal of the memory from the apparatus,
   wherein said processing means, in response to a detection of removal by said detection means, suspends the control of the apparatus if said printing means is not being controlled by said processing means, and is initialized for the control of the apparatus if said printing means is being controlled by said processing means.

2. A printing apparatus according to claim 1, wherein said processing means is a stored-programmed processor.

3. An electronic apparatus comprising:
   connection means for detachably connecting a memory to the apparatus;
   output means for outputting data stored in the memory connected to the apparatus through said connection means;
   control means for controlling the apparatus, said control means reading out the data from the memory connected to the apparatus through said connection means to control said output means while the data is being read out;
   detection means for detecting removal of the memory from said connection means;
   control signal generating means, responsive to a detection of removal, for generating a halt signal and reset signal to halt the operation of and reset said control means when the detection occurs and the data is being read-out by said control means and generating only the halt signal when the detection occurs and data is not being read-out by said control means,
   wherein in response to the halt signal the operation of said control means is halted and wherein in response to the reset signal said control means is reset.

4. An electronic apparatus according to claim 3, wherein said output means is a printer.

5. An electronic apparatus according to claim 3, wherein said detection means produces a detection signal indicating removal of the memory means from said connection means, wherein said control signal generating means includes:
   a switch which produces an ON signal when the memory is removed form said connection means; and
   a pulse generator responsive to the ON signal and also responsive to the detection signal for generating a one-shot pulse, and wherein said control means, responsive to the ON signal from said switch, halts its control of the apparatus, and responsive to the one-shot pulse from said pulse generator, is reset.

6. An electronic apparatus according to claim 3 wherein said memory is a read-only memory.

7. An electronic apparatus according to claim 3, further comprising means for setting a flag signal indicative of said control means being in control of the data reading from said memory.

* * * * *

UNITED STATES PATENT AND TRADEMARK OFFICE
CERTIFICATE OF CORRECTION

PATENT NO. : 5,020,022
DATED : May 28, 1991
INVENTOR(S) : YOSHIKAZU SHIBAMIYA

It is certified that error appears in the above-identified patent and that said Letters Patent is hereby corrected as shown below:

IN TITLE PAGE, ITEM [63]

Insert: -- Related U.S. Application Data

Continuation of Ser. No. 028,012, filed Mar. 18, 1987, which is a continuation of Ser. No. 709,610, filed Mar. 8, 1985. --.

IN [57] ABSTRACT

Line 1, "An printing" should read --A printing--.

COLUMN 1

Line 56, "and processing" should read --processing and--.

COLUMN 3

Line 47, "other," should read --other--.

COLUMN 4

Line 9, "int he" should read --in the--.
Line 21, "stored-programmed" should read --store-programmed--.

UNITED STATES PATENT AND TRADEMARK OFFICE
CERTIFICATE OF CORRECTION

PATENT NO. : 5,020,022
DATED : May 28, 1991
INVENTOR(S) : YOSHIKAZU SHIBAMIYA

It is certified that error appears in the above-identified patent and that said Letters Patent is hereby corrected as shown below:

COLUMN 4

Line 62, "claim 3" should read --claim 3,--.

Signed and Sealed this

Sixth Day of July, 1993

Attest:

MICHAEL K. KIRK

Attesting Officer

Acting Commissioner of Patents and Trademarks